United States Patent
Newman

[19]

[11] Patent Number: 6,111,308

[45] Date of Patent: *Aug. 29, 2000

[54] GROUND PLANE FOR PLASTIC ENCAPSULATED INTEGRATED CIRCUIT DIE PACKAGES

[75] Inventor: Robert A. Newman, Santa Clara, Calif.

[73] Assignee: Advanced Micro Devices, Inc., Sunnyvale, Calif.

[*] Notice: This patent is subject to a terminal disclaimer.

[21] Appl. No.: 08/686,979

[22] Filed: Jul. 25, 1996

Related U.S. Application Data

[63] Continuation of application No. 08/447,930, May 23, 1995, Pat. No. 5,559,369, which is a continuation of application No. 07/971,421, Nov. 4, 1992, abandoned, which is a continuation-in-part of application No. 07/822,330, Jan. 15, 1992, Pat. No. 5,208,188, and a continuation-in-part of application No. 07/710,416, Jun. 5, 1991, Pat. No. 5,237,205, said application No. 07/822,330, Jan. 15, 1992, Pat. No. 5,208,188, and a continuation-in-part of application No. 07/710,416, Jun. 5, 1991, Pat. No. 5,237,205, and a division of application No. 07/415,844, Oct. 2, 1989, Pat. No. 5,068,708.

[51] Int. Cl.[7] .................................................. H01L 23/495

[52] U.S. Cl. .......................... 257/676; 257/668; 257/747

[58] Field of Search ..................................... 257/659, 668, 257/676, 747, 678, 787, 675, 783; 361/765, 771; 438/118, 112

[56] References Cited

U.S. PATENT DOCUMENTS

| | | | |
|---|---|---|---|
| 3,943,623 | 3/1976 | Mizutani et al. | 29/588 |
| 3,999,285 | 12/1976 | Lewis et al. | 29/588 |
| 4,147,889 | 4/1979 | Andrews et al. | 174/52 FP |

(List continued on next page.)

FOREIGN PATENT DOCUMENTS

| | | | |
|---|---|---|---|
| 82302263 | 5/1982 | European Pat. Off. | H01L 23/14 |
| 0 461 316 | 6/1990 | European Pat. Off. | H01L 21/58 |
| 56-62349 | 5/1981 | Japan | H01L 23/48 |
| 59-207645 | 11/1984 | Japan | H01L 23/48 |

(List continued on next page.)

OTHER PUBLICATIONS

"Electric Materials", vol. 22, No. 7, Jul. 1, 1983, pp. 27–28.
"Modified Polyimide for Low End Packaging", Research Disclosure, Jan., 1987, p. 32.
MM Multi–Layer Molded High Performance PQFP, published by Intel containing the three following disclosures: Seth et al., "Plastic Quad Float Pack", 1989 Japan International Electronic Manufacturing Technology Symposium, Apr. 27, 1989, pp. 1–1 to 1–7.

(List continued on next page.)

*Primary Examiner*—Donald L. Monin, Jr.
*Assistant Examiner*—Michael Dietrich
*Attorney, Agent, or Firm*—Fliesler, Dubb, Meyer & Lovejoy LLP

[57] ABSTRACT

A plastic encapsulated integrated circuit package is disclosed which comprises a multilayer ground plane assembly bonded to a lead frame with an integrated circuit die bonded to the composite assembly. The multilayer ground plane assembly is first formed by bonding together a metal sheet, such as a copper sheet, and a thermally conductive insulating layer, such as a thermally conductive polyimide material, to which is also bonded a layer of a b-stage adhesive material. The ground plane assembly may be bonded to the lead frame by placing the b-stage adhesive layer of the ground plane assembly against the lead frame and heating the ground plane assembly and lead frame to a temperature of from about 120° C. to just under 200° C. for a time period not exceeding about 10 seconds to bond the b-stage adhesive layer to the lead frame without oxidizing the lead frame. An integrated circuit die is then attached to the composite assembly with an adhesive and the die attached assembly is then cured in a non-oxidizing atmosphere in an oven at approximately 150° C. for about 90 minutes to cure the adhesive and the b-stage adhesive layer. The die may then be electrically connected to the lead frame. The bonded together ground plane/lead frame/die composite assembly may then be placed in a mold and encapsulated in plastic.

5 Claims, 3 Drawing Sheets

U.S. PATENT DOCUMENTS

| | | | |
|---|---|---|---|
| 4,396,936 | 8/1983 | McIver et al. | 357/81 |
| 4,410,927 | 10/1983 | Butt | 361/386 |
| 4,446,477 | 5/1984 | Currie et al. | 357/74 |
| 4,480,262 | 10/1984 | Butt | 357/74 |
| 4,594,770 | 6/1986 | Butt | 29/588 |
| 4,680,613 | 7/1987 | Daniels et al. | 357/72 |
| 4,783,428 | 11/1988 | Kalfus | 437/20 |
| 4,811,081 | 3/1989 | Lyden | 357/80 |
| 4,843,695 | 7/1989 | Doe et al. | 29/827 |
| 4,870,474 | 9/1989 | Karashima | 357/70 |
| 4,891,687 | 1/1990 | Mallik et al. | 357/70 |
| 4,990,719 | 2/1991 | Wright | 174/52.4 |
| 5,068,708 | 11/1991 | Newman | 257/783 |
| 5,073,521 | 12/1991 | Braden | 437/209 |
| 5,093,989 | 3/1992 | Beltz | 29/878 |
| 5,208,188 | 5/1993 | Newman | 437/220 |
| 5,237,205 | 8/1993 | Newman | 257/783 |
| 5,559,369 | 9/1996 | Newman | 257/668 |

FOREIGN PATENT DOCUMENTS

| | | | |
|---|---|---|---|
| 60-102751 | 6/1985 | Japan | H01L 21/58 |
| 60-236236A | 11/1985 | Japan | H01L 23/26 |
| 62-219546 | 9/1987 | Japan | H01L 23/14 |
| 63-124759 | 8/1988 | Japan | H01L 23/50 |
| 1-93156 | 4/1989 | Japan | H01L 23/50 |
| 1-169934 | 7/1989 | Japan | H01L 21/52 |
| 2-15663 | 1/1990 | Japan | H01L 23/50 |
| 2-296882 | 12/1990 | Japan | C09J 7/02 |
| 3-64386 | 3/1991 | Japan . | |
| 3-132063 | 6/1991 | Japan | H01L 23/50 |

OTHER PUBLICATIONS

Mallik et al., "Multi–Layer Molded Plastic Package", 1989 Japan International Electronic Manufacturing Technology Symposium, Apr. 27, 1989, pp. 2–1 to 2–9.

Mallik, et al., "High Performance PQFP", 39th Electronic Components Conference, May 24, 1989, pp. 3–1 to 3–9.

GROUND PLANE FOR PLASTIC ENCAPSULATED INTEGRATED CIRCUIT DIE PACKAGES

This application is a continuation of Ser. No. 08/447,930, filed May 23, 1995, U.S. Pat. No. 5,559,369, which is a file wrapper continuation of Ser. No. 07/971,421, filed Nov. 4, 1992, now abandoned, which is a continuation in part of Ser. No. 07/822,330, filed Jan. 15, 1992, now U.S. Pat. No. 5,208,188, and a continuation in part of Ser. No. 07/710,416, filed Jun. 5, 1991, now U.S. Pat. No. 5,237,205. Ser. No. 07/822,330 is a continuation in part of said Ser. No. 07/710,416, Ser. No. 07/710,416 being a divisional of Ser. No. 07/415,844, filed Oct. 2, 1989, now U.S. Pat. No. 5,068,708.

BACKGROUND OF THE INVENTION

1. Field of the Invention

This invention relates to plastic encapsulated integrated circuit die packages. More particularly, this invention relates to formation of a multilayer ground plane assembly for an integrated circuit package which is capable of also providing heat dissipation and mechanical support for the package as it is being formed.

2. Description of the Related Art

In the packaging of integrated circuit structures, it is known to provide metal portions adjacent the integrated circuit die which electrically function as ground planes to reduce inductance, and thereby speed the performance of the device, as well as to provide a heat sink or dissipation means.

For example, Andrews U.S. Pat. No. 4,147,889 discloses a chip carrier comprising a printed circuit board having a metal layer formed on each surface. The metal layer on one surface comprises an external heat sink of substantial surface area while the metal layer on the side to which the chip is bonded is patterned to form lead fingers and a central metal heat sink to which the chip is bonded. According to the patentees, holes may be provided through the printed circuit board which are subsequently filled with metal to provide a direct metal contact between the heat sink to which the chip is bonded and the external heat sink.

Butt U.S. Pat. No. 4,410,927 teaches a casing for an electrical component such as an integrated circuit die with a metal base member onto which the die is bonded using an epoxy adhesive. A lead frame is also sealed and bonded to the metal base member. A metal housing member is mounted upon the base member to form an enclosed casing.

Daniels et al U.S. Pat. No. 4,680,613 discloses a low impedance package for an integrated circuit die comprising a lead frame without a central paddle and a ground plate which forms the die attach plane and which is spaced from and parallel to the lead frame. A dielectric layer is formed between the lead frame and the ground plate.

Katagiri Japanese Patent document 59-207645 discloses a semiconductor device and lead frame wherein a heat dissipating plate is connected to a semiconductor chip through a mounting agent which is a good heat conductor. After connecting the chip to leads via wires, the chip and leads are sealed by a resin mold layer so that the surface of the heat dissipating plate is exposed.

Usually, however, it is more difficult to incorporate a metal ground plane/heat sink into a plastic-encapsulated integrated circuit package because of the difficulty of orienting and mechanically assembling together the integrated circuit die, lead frame, and ground plane/heat sink prior to the encapsulation step which will then serve to provide the mechanical bonding together of the components comprising the package.

It would, therefore be desirable to provide a plastic-encapsulated integrated circuit package incorporating therein an electrical ground plane/thermal heat sink and a method of assembling such a structure which will provide a mechanically stable and strong structure prior to encapsulation.

SUMMARY OF THE INVENTION

It is, therefore, an object of this invention to provide a plastic encapsulated integrated circuit structure comprising a multilayer ground plane assembly capable of being bonded to a lead frame and an integrated circuit die.

These and other objects of the invention will be apparent from the following description and accompanying drawing.

DETAILED DESCRIPTION OF THE INVENTION

Figure 1:
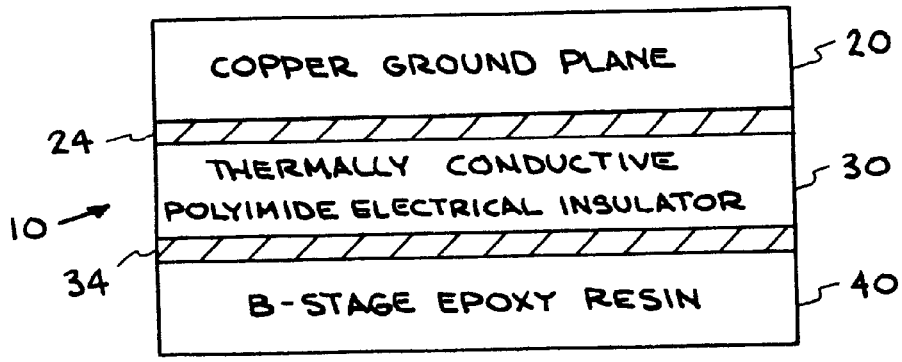
FIG. 1 is a vertical cross-sectional view of the ground plane assembly of the invention.

Referring now to FIG. 1, a ground plane assembly 10 is generally indicated comprising a metal ground plane 20, an insulating layer 30, and a b-stage adhesive layer 40 bonded to one another. The representation of these layers depicted in FIG. 1 will be understood to not be in scale, with the thickness of some of the layers exaggerated for illustrative purposes. Ground plane assembly 10, which will be bonded to a lead frame, as discussed below, is, in accordance with the invention, preassembled together as an integrally formed unit independently, separately, and prior to such bonding to a lead frame.

Metal ground plane 20 in assembly 10 is bonded to electrically insulating film 30 using an adhesive 24 which may comprise a high temperature-resistant adhesive such as, for example, CL101, a high temperature epoxy adhesive available from the Chomerics company which is capable of withstanding temperatures as high as 300° C. By use of the term "high temperature adhesive" is meant an adhesive which will be capable of withstanding the temperature used to subsequently bond ground plane assembly 10 of the invention to a lead frame, i.e., the temperature at which the b-stage adhesive will bond assembly 10 to a lead frame. Such a bonding temperature will normally be up to just below about 200° C.

Bonded to the opposite surface of insulating film 30, using a second adhesive layer 34, which may comprise the same high temperature-resistant adhesive as previously used for adhesive layer 24, is b-stage adhesive layer 40.

Metal ground plane 20 generally comprises a copper foil or sheet stock ranging in thickness from about 1.5 to 20 mils. As shown in the figures, metal ground plane 20 comprises a unitary member that acts as a combination ground plane and heat sink. Preferably the thickness will range from about 5 to 10 mils to provide both the desired electrical ground plane as well as providing good heat conductivity.

Insulating layer 30 comprises a material which will electrically insulate metal ground plane 20 from either the lead frame or the integrated circuit die as will be explained below. Insulating layer 30 ranges in thickness from about 1 to about 3 mils, and preferably comprises a polyimide film such as, for example, Kapton. Most preferably, insulating layer 30, while exhibiting electrical insulation properties, will be a heat conductor. Such materials are commercially available, for example, as alumina-filled polyimide films.

For example, it has been found that the structure of the invention provides about 11% better heat conductivity over conventionally formed structures when a conventional polyimide insulating layer is used, but from 15 to 20% improvement in heat conductivity when a heat conducting polyimide insulating film is used.

The b-stage adhesive film layer 40 comprises a cross-linkable adhesive material, such as an epoxy adhesive or equivalent adhesive, which has been partially cured or crosslinked to a degree where it resembles cheese in that it is a non-sticky solid which is still flexible and capable of further curing, as well as adherence to other materials upon application of heat to assembly 10. Other such b-stage adhesives equivalent to a b-stage epoxy adhesive include cross-linkable polyamide, phenolic rubber, and polyester resins previously cured to a b-stage.

The thickness of adhesive layer 40 generally ranges from about 1 to about 3 mils. An example of a commercially available b-stage epoxy adhesive which may be used in the practice of the invention is Amicon C990 epoxy resin (w/o silver flake filler) available from Emerson and Cuming, Inc., a division of W.R. Grace and Company.

Figure 2:
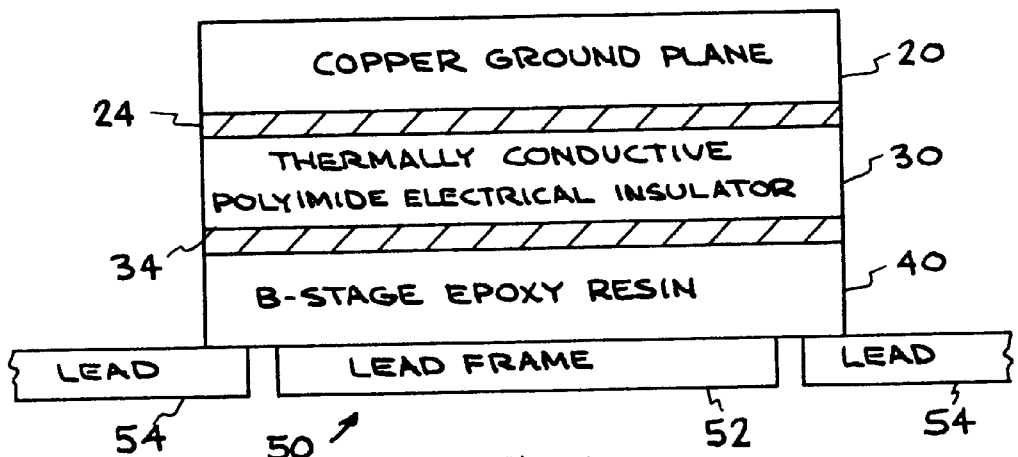
FIG. 2 is a fragmentary vertical cross-sectional view of the ground plane assembly of the invention bonded to a lead frame.
Figure 3:
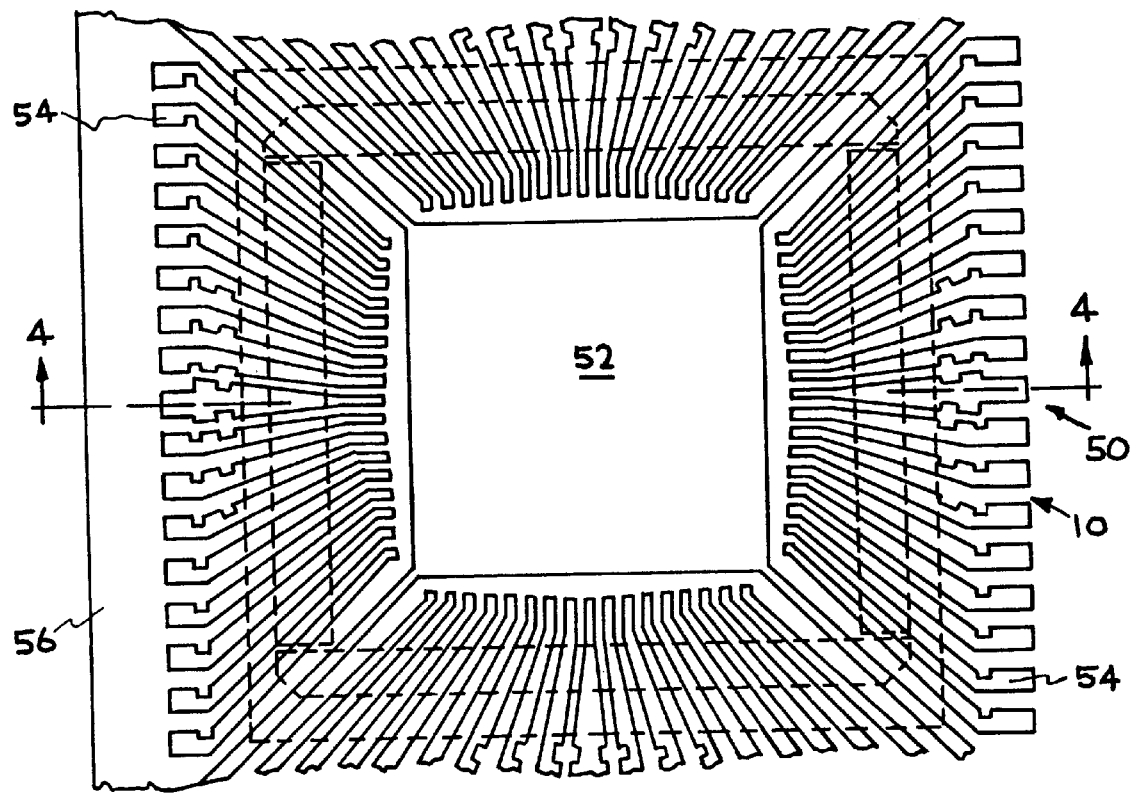
FIG. 3 is a top view of the lead frame shown in FIG. 2 with the outline of the ground plane assembly bonded thereto shown in dotted lines to permit view of the lead frame thereunder.

Referring now to FIG. 2, ground plane assembly 10 of the invention can now bonded to a conventional metal lead frame 50 which, in the embodiment shown in FIG. 2, is provided with a center die paddle 52 and lead fingers 54 which radiate out on all four sides of lead frame 50, as can best be seen in FIG. 3. As is known in the art, lead frame 50 acts as a connector for electrically coupling a die to external circuit elements.

As also seen in FIG. 3, the length and width of ground plane assembly 10, i.e., the area of assembly 10 in contact with lead frame 50, is larger than the length and width of center die paddle 52 so that ground plane assembly 10 is in contact with, and bonded to, the inner ends of lead frame leads 54 to thereby impart mechanical strength to the bonded together lead frame/ground plane composite assembly after the outer portions 56 of lead frame 50 are severed, as is commonly practiced in the art, to thereby electrically isolate the individual leads 54 from one another. Normally, such a severing operation is carried out after assembly and connection of the integrated circuit die to the lead frame and the encapsulation of the die and lead frame within a plastic encapsulant which provides the needed mechanical stability to permit severance of lead frame outer lead portions 56 from leads 54.

Ground plane assembly 10 is bonded to lead frame 50 by centrally positioning ground plane assembly 10 over lead frame 50 with the exposed surface of b-stage adhesive layer 40 resting on lead frame 50. Ground plane assembly 10 and lead frame 50 are then heated to a temperature of from about 120° C. to just below 200° C. for about 2 to about 10 seconds, preferably about 5 seconds, to soften and melt b-stage adhesive layer 40 sufficiently to cause lead frame 50 to bond to ground plane assembly 10 via b-stage adhesive layer 40. By a temperature of "just below 200° C." is meant a temperature of about 199° C.

It should be noted that it is important to the practice of this invention that the lead frame 50/ground plane assembly 10 sandwich or composite assembly not be heated (in an oxidizing atmosphere) for a temperature/time period sufficient to oxidize the metal lead frame which is conventionally formed using copper and which is capable of rapidly oxidizing, i.e., within 15–20 seconds at temperatures exceeding 200° C.

It is not necessary to complete the curing of the b-stage adhesive layer 40 at this time since the die 100 is first bonded either to central die frame paddle 52 of metal lead frame 50 or, if there is no central die frame paddle, directly to b-stage layer 40 using another adhesive material, which preferably comprises the same material as b-stage adhesive layer 40.

Figure 4:
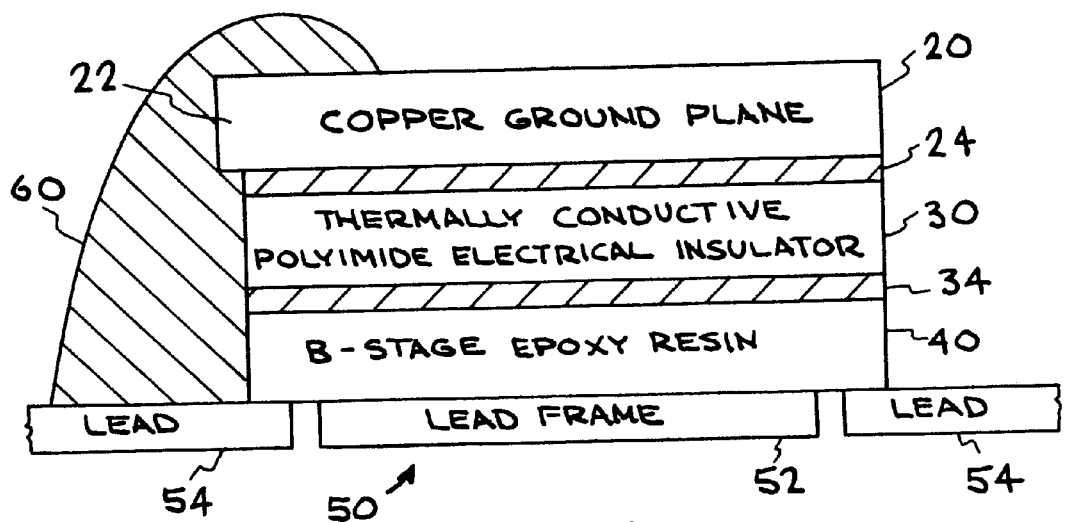
FIG. 4 is a fragmentary vertical cross-sectional view taken along lines 4—4 of the structure of FIG. 3 showing the bonding of the ground plane to a lead on the lead frame.

After ground plane assembly 10 and lead frame 50 have been bonded together, one or more leads 54 may be electrically and thermally bonded to metal ground plane layer 20, as shown in FIG. 4, using an electrically conductive material 60 which may, for example, comprise a silver-filled epoxy material having sufficient metal filler to render the epoxy resin electrically conductive as well as thermally conductive. If desired, metal ground plane layer 20 may be provided with one or more tabs 22, as shown in FIG. 4, to facilitate such bonding to leads 54 on lead frame 50. These tabs may be electrically connected to leads 54 by, for example, spot welding.

Figure 5:
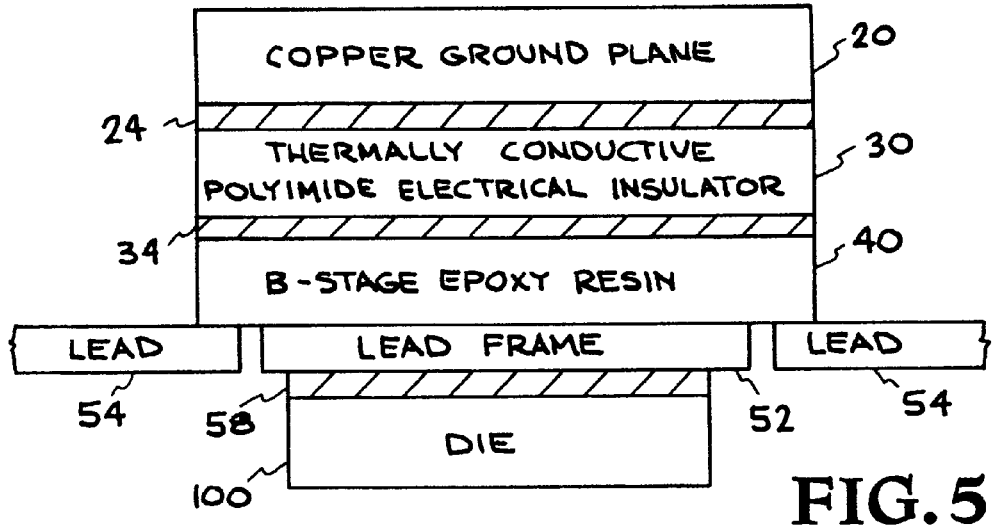
FIG. 5 is a fragmentary vertical cross-sectional view of the ground plane assembly of the invention bonded to a lead frame with an integrated circuit die bonded to the composite assembly.

As shown in FIG. 5, an integrated circuit die 100 may now be physically bonded to die frame paddle 52 of the bonded composite assembly at 58 using an adhesive material which is preferably the same as, or similar to, the material used in forming b-stage adhesive layer 40. For example, an epoxy adhesive may be used similar to that used in forming b-stage layer 40 from an epoxy material, except that the epoxy adhesive used here is preferably an electrically conductive epoxy, e.g., an epoxy filled with silver flake such as Amicon C990 conductive epoxy resin. Use of such an electrically conductive material here provides a floating potential which is capacitively coupled to metal ground plane layer 20.

The b-stage adhesive layer 40 and the conductive adhesive material used as the adhesive to bond the integrated circuit die to die paddle 52 of lead frame 50 may now be cured by heating the structure in a nitrogen or other non-oxidizing atmosphere to a temperature of from about 120° C. up to not exceeding just under 200° C. and maintaining the structure at this temperature for from about 30 to about 200 minutes, preferably from about 30 to about 120 minutes, usually about 90 minutes, to fully cure the materials.

After physical attachment of die 100 to lead paddle 52 of lead frame 50, the inner ends of leads 54 may then be conventionally attached (electrically connected) to the appropriate die pads on die 100 using bond wires (not shown). This is usually accomplished with an automatic wire bonder such as, for example, a K&S 1482 gold wire bonder, available from Kulicke and Soffa Industries, Inc.

Figure 7:
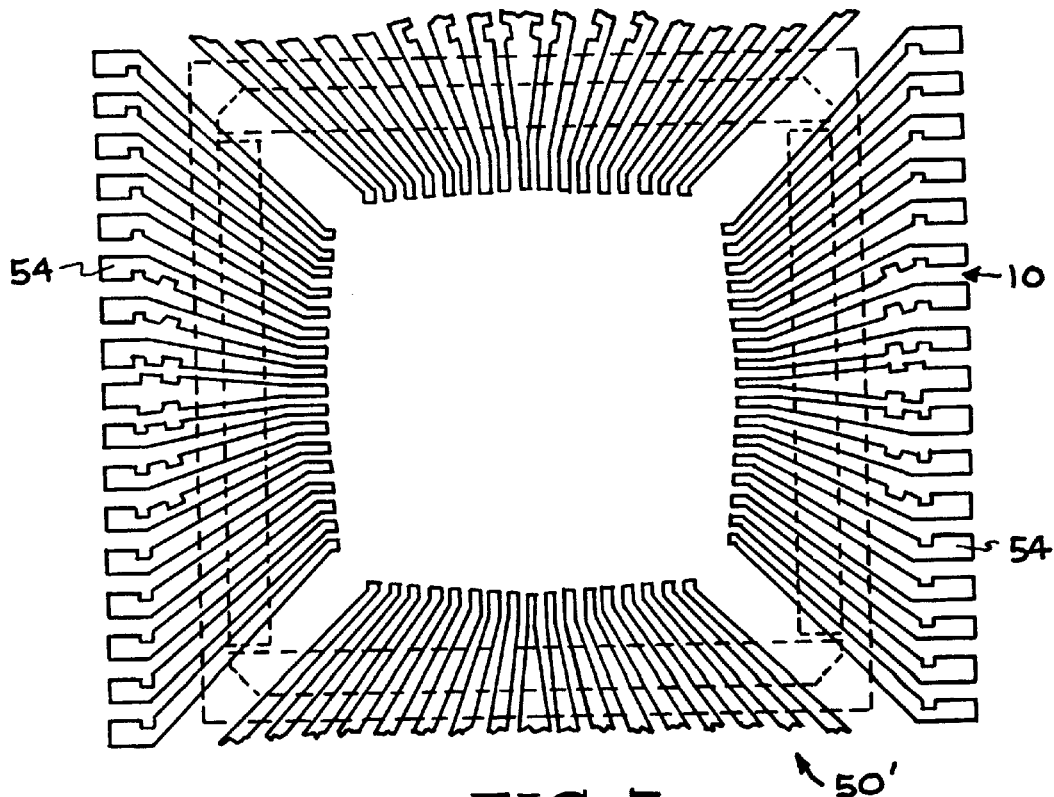
FIG. 7 is a top view of the lead frame shown in FIG. 6 with the outline of the ground plane assembly bonded thereto shown in dotted lines to permit view of the lead frame thereunder.
Figure 6:
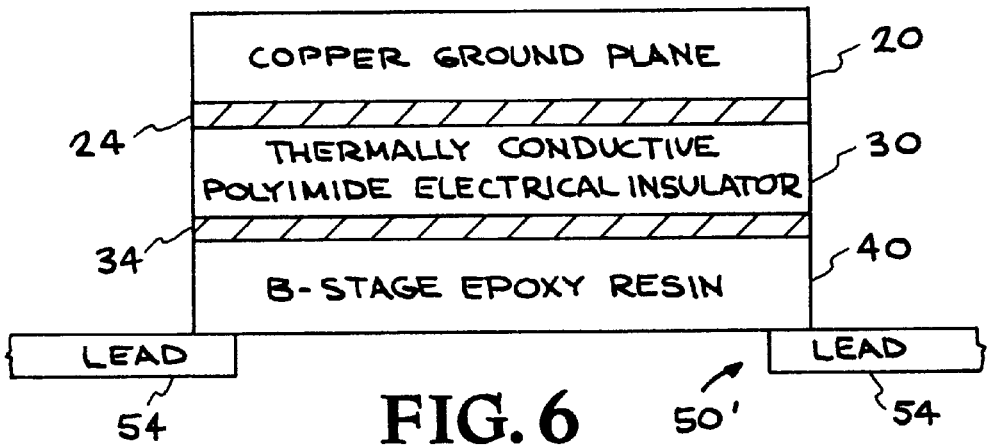
FIG. 6 is a fragmentary vertical cross-sectional view of another embodiment of the invention showing the ground plane assembly of the invention bonded solely to the leads of a lead frame formed without a center die paddle.
Figure 8:
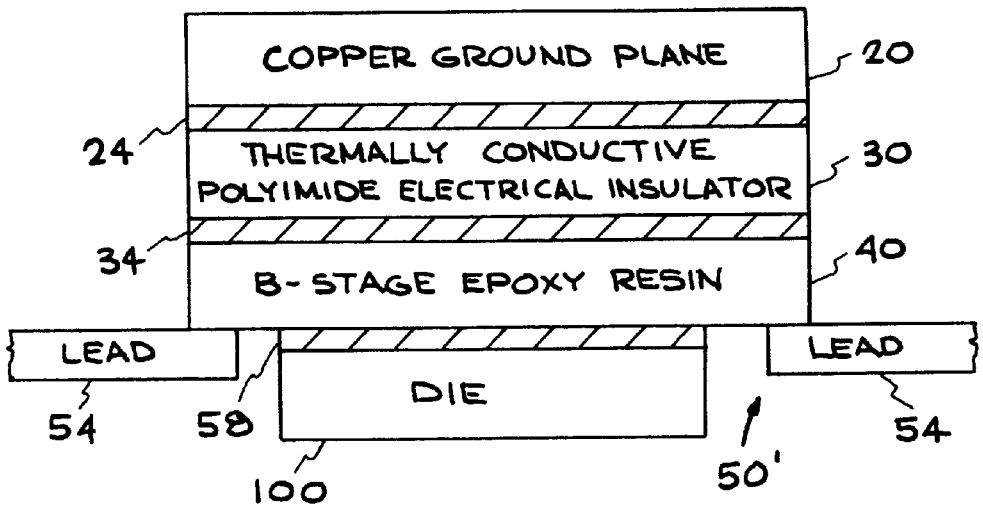
FIG. 8 is a fragmentary vertical cross-sectional view of the ground plane assembly of the invention bonded to a lead frame as in FIGS. 6 and 7, but with an integrated circuit die bonded directly to the ground plane assembly.

Turning now to FIGS. 6–8, another embodiment of the invention is illustrated wherein lead frame 50', as best seen in FIG. 7, does not have a central die paddle 52. Ground plane assembly 10 is, therefore, bonded to lead frame 50' solely by bonding b-stage adhesive layer 40 directly to lead frame fingers 54.

In this embodiment, integrated circuit die 100 is then bonded directly to b-stage adhesive layer 40, as shown in FIG. 8, preferably using, as an adhesive, an adhesive material which is at least chemically and mechanically compatible with b-stage adhesive layer 40 of ground plane assembly 10. Most preferably, the adhesive material comprises the same adhesive material as that used in b-stage adhesive layer 40 but in uncured form.

Thus, the invention provides a multilayer preassembled ground plane subassembly which may be bonded to a lead frame and to which an integrated circuit die may be bonded, and electrically connected to the lead frame leads, prior to encapsulation in plastic to form a ground plane/lead frame/die assembly which is a mechanically strong assembly which may be placed in an plastic encapsulation mold without the need for external means to retain the assembly together prior to encapsulation.

Having thus described the invention, what is claimed is:

1. A multilayer subassembly suitable for use in forming a plastic encapsulated integrated circuit package comprising:
    a) a metal layer;
    b) an insulating layer comprising polyimide material having a first side bonded to said metal layer with a high temperature-resistant adhesive and a second side opposite said first side; and
    c) an adhesive layer bonded to said second side of said insulating layer using said high temperature-resistant adhesive, said adhesive layer capable of bonding the subassembly to a lead frame subsequent to formation of the subassembly by heating said adhesive layer.

2. A multilayer subassembly suitable for use in forming a plastic encapsulated integrated circuit package comprising:
    a) a metal layer;
    b) an insulating layer having a first side bonded to said metal layer with a high temperature-resistant adhesive and a second side opposite said first side; and
    c) an adhesive layer bonded to said second side of said insulating layer using said high temperature-resistant adhesive, said adhesive layer capable of bonding the subassembly to another component subsequent to formation of the subassembly by heating said subassembly.

3. A multilayer subassembly suitable for use in forming a plastic encapsulated integrated circuit package, the package including a die assembly having an integrated circuit and means for electrically connecting the integrated circuit to external circuit elements the subassembly comprising:
    a) a unitary ground plane/heat sink layer for dissipating electrical and thermal energy from the die assembly;
    b) an insulating layer having a first side bonded to said metal ground plane/heat sink layer and a second side opposite said first side;
    c) an adhesive layer bonded to said second side of said insulating layer for bonding the multilayer subassembly to the die assembly subsequent to formation of the subassembly; and
    d) a means for electrically coupling said unitary ground plane/heat sink layer to the die assembly.

4. A multilayer subassembly suitable for use in forming a plastic encapsulated integrated circuit package, the package including a die assembly having an integrated circuit and means for electrically connecting the integrated circuit to external circuit elements, the subassembly comprising:
    a) a unitary ground plane/heat sink layer for dissipating electrical and thermal energy from the die assembly;
    b) an insulating layer having a first side bonded to said metal ground plane/heat sink layer and a second side opposite said first side;
    c) an adhesive layer bonded to said second side of said insulating layer for bonding the multilayer subassembly to the die assembly subsequent to formation of the sub assembly; and
    d) a first attaching means provided between said unitary ground plane/heat sink layer and said electrically insulating layer for attaching said unitary ground plane/heat sink layer and said electrically insulating layer, and a second attaching means provided between said electrically insulating layer and said adhesive layer for attaching said electrically insulating layer and said adhesive layer.

5. A multilayer subassembly suitable for use in forming a plastic encapsulated integrated circuit package, the package including a die assembly having an integrated circuit and means for electrically connecting the integrated circuit to external circuit elements, the subassembly comprising:
    a) a unitary ground plane/heat sink layer for dissipating electrical and thermal energy from the die assembly;
    b) an electrically insulating layer having a first side bonded to said metal ground plane/heat sink layer and a second side opposite said first side;
    c) an adhesive layer for bonding the multilayer subassembly to the die assembly subsequent to formation of the subassembly, said adhesive layer being provided on said second side of said insulating layer;
    d) a first attaching means provided between said unitary ground plane/heat sink layer and said electrically insulating layer for attaching said unitary ground plane/heat sink layer and said electrically insulating layer; and
    e) a second attaching means provided between said electrically insulating layer and said adhesive layer for attaching said electrically insulating layer and said adhesive layer.

* * * * *